US012727464B2

(12) United States Patent
Chu et al.

(10) Patent No.: US 12,727,464 B2
(45) Date of Patent: Sep. 1, 2026

(54) POWER TAP CELL FOR FRONT SIDE POWER RAIL CONNECTION TO BSPDN

(71) Applicant: INTERNATIONAL BUSINESS MACHINES CORPORATION, Armonk, NY (US)

(72) Inventors: Albert M. Chu, Nashua, NH (US); Nicholas Anthony Lanzillo, Wynantskill, NY (US); Albert M. Young, Fishkill, NY (US); Junli Wang, Slingerlands, NY (US); Brent A. Anderson, Jericho, VT (US); Ruilong Xie, Niskayuna, NY (US); Lawrence A. Clevenger, Saratoga Springs, NY (US); Reinaldo Vega, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 356 days.

(21) Appl. No.: 18/062,624

(22) Filed: Dec. 7, 2022

(65) Prior Publication Data

US 2024/0194601 A1 Jun. 13, 2024

(51) Int. Cl.
*H10W 20/41* (2026.01)
*G06F 30/392* (2020.01)
(Continued)

(52) U.S. Cl.
CPC ........ *H10W 20/427* (2026.01); *G06F 30/392* (2020.01); *G06F 30/394* (2020.01);
(Continued)

(58) Field of Classification Search
CPC . H01L 23/5286; G06F 30/392; G06F 30/394; H10D 84/856; H10D 84/83; H10D 84/85; H10W 20/427; H10W 20/42
See application file for complete search history.

(56) References Cited

U.S. PATENT DOCUMENTS 10,636,739 B2 4/2020 Beyne et al.
11,133,254 B2 9/2021 Lai et al.
(Continued)

OTHER PUBLICATIONS

Prasad, D., Nibhanupudi, S. T., Das, S., Zografos, O., Chehab, B., Sarkar, S., . . . & Sinha, S. (Dec. 7, 2019). Buried power rails and back-side power grids: Arm® CPU power delivery network design beyond 5nm. In 2019 IEEE International Electron Devices Meeting (IEDM) (pp. 1-4) IEEE.
(Continued)

*Primary Examiner* — Ratisha Mehta
*Assistant Examiner* — Brad A Knudson
(74) *Attorney, Agent, or Firm* — Harrity & Harrity, LLP

(57) ABSTRACT

A semiconductor structure is presented having a plurality of circuit rows, a plurality of first power rails positioned on front sides of the plurality of circuit rows, a plurality of second power rails positioned on back sides of the plurality of circuit rows, and power tap cells associated with each the plurality of circuit rows, wherein each of the power tap cells includes one or more power vias connecting at least one first power rail of the plurality of first power rails to at least one second power rail of the plurality the second power rails. In one instance, the plurality of second power rails are orthogonal to the plurality of first power rails. in another instance, the plurality of first power rails are horizontally offset from the plurality of second power rails. The one or more power vias include at least two or more different sized power vias.

17 Claims, 7 Drawing Sheets

(51) Int. Cl.

| | |
|---|---|
| ***G06F 30/394*** | (2020.01) |
| ***H10D 84/85*** | (2025.01) |
| ***H10W 20/20*** | (2026.01) |
| ***H10W 20/42*** | (2026.01) |
| *H10D 84/83* | (2025.01) |

(52) U.S. Cl.

CPC .......... *H10D 84/856* (2025.01); *H10W 20/20* (2026.01); *H10W 20/42* (2026.01); *H10D 84/83* (2025.01)

(56) References Cited

U.S. PATENT DOCUMENTS

| | | | | |
|---|---|---|---|---|
| 11,158,580 | B2 | 10/2021 | Sio et al. | |
| 2018/0145030 | A1 | 5/2018 | Beyne et al. | |
| 2020/0019666 | A1* | 1/2020 | Lai | G06F 30/398 |
| 2020/0266169 | A1 | 8/2020 | Kang et al. | |
| 2020/0373242 | A1 | 11/2020 | Hiblot et al. | |
| 2021/0118798 | A1* | 4/2021 | Liebmann | H01L 23/5226 |
| 2021/0343646 | A1 | 11/2021 | Chen et al. | |
| 2021/0343650 | A1 | 11/2021 | Peng et al. | |
| 2022/0028758 | A1 | 1/2022 | Song et al. | |
| 2022/0068813 | A1* | 3/2022 | Chen | H01L 23/5286 |
| 2022/0077062 | A1 | 3/2022 | Van Dal et al. | |
| 2022/0130760 | A1 | 4/2022 | Wu et al. | |
| 2022/0130968 | A1 | 4/2022 | Peng et al. | |
| 2022/0181258 | A1* | 6/2022 | Liebmann | H10D 30/67 |
| 2023/0069137 | A1* | 3/2023 | Tsai | H01L 23/481 |
| 2023/0420369 | A1* | 12/2023 | Lin | H01L 23/5283 |

OTHER PUBLICATIONS

Sisto, G., Chehab, B., Genneret, B., Baert, R., Chen, R., Weckx, P., . . . & Milojevic, D. (Jul. 6, 2021). IR-Drop Analysis of Hybrid Bonded 3D-ICs with Backside Power Delivery and μ-& n-TSVs. In 2021 IEEE International Interconnect Technology Conference (IITC) (pp. 1-3). IEEE.

* cited by examiner

POWER TAP CELL FOR FRONT SIDE POWER RAIL CONNECTION TO BSPDN

BACKGROUND

The present invention relates generally to semiconductor devices, and more specifically, to constructing a front side power rail connection to a backside power distribution network (BSPDN) by using power tap cells.

Semiconductor devices are used in a variety of electronic applications, such as personal computers, cell phones, digital cameras, and other electronic equipment. Semiconductor devices are usually fabricated by sequentially depositing insulating or dielectric layers, conductive layers, and semiconductive layers of material over a semiconductor substrate, and patterning the various material layers using lithography to form circuit components and elements thereon.

The semiconductor industry has experienced rapid growth due to improvements in the integration density of a variety of electronic components (e.g., transistors, diodes, resistors, capacitors, etc.). For the most part, this improvement in integration density has come from shrinking the semiconductor process node. With the increased demands for miniaturization, higher speed, greater bandwidth, lower power consumption, and lower latency, chip layout has become more complicated and difficult to achieve in the production of semiconductor dies.

Fin-based active devices, primarily transistors, are extensively applied for the production of standard cells and other active device configurations processed in the front-end-of-line (FEOL) part of the integrated circuit fabrication process, and include FinFETs, as well as more recent devices based on nanowires or nanosheets. An example technology involves the use of buried interconnect rails in the FEOL. Buried power rails (BPRs) can directly connect the transistors in the FEOL to a power delivery network located entirely on the back side of an integrated circuit (IC) chip. In particular, the source or drain area of a number of transistors are directly connected to a buried rail. The current practice for realizing this configuration is to produce an interconnect via to the buried rail, and to couple the interconnect via to the source or drain area through a local interconnect that is part of the source/drain contact level of the chip, also referred to as the "middle end of line," which is a transition between the active devices in the FEOL, and the interconnect levels (M1, M2, etc.,) in the back-end-of-line (BEOL).

Some implementations of this approach have a number of drawbacks. As the rails are buried underneath the active devices, the size of the BPR is limited by the cell-to-cell space between two nearby active regions. As cell height scales down, so does the cell-to-cell space, the BPR size decreases, and its resistance increases, which degrades the IC performance.

Within standard logic cells, power to the devices (e.g., transistors) is supplied to the source/drain contacts through power rails which connect to the rest of the power delivery network (PDN) in BEOL metal layers. The power rails usually run across adjacent cells in an orientation that is referred to as an east-west orientation. Since the power rails need to supply power to a number of cells, the power rails are often implemented with much larger sizes (e.g., larger width) compared to standard routing tracks/signal lines that are used within the cells. Usually the size difference of the power rail compared to a normal routing line can be as large as 3 to 4 times, thus the power rails use a significant amount of area within the cell design. The larger critical dimension of the power rails is needed to maintain an adequate resistance through the rail in order to maintain adequate power distribution targets including IR drop and frequency of which the power rails need to be supplied within the device.

A prior approach was devised to reduce the lateral (width) size of the power rails by making them deeper (e.g., having a higher aspect ratio) in size in order to allow a smaller top-down cross-section (e.g., smaller width metal lines), while effectively keeping the total metal volume in the power rail either the same or increased. The increase in aspect ratio provides for lower resistance across the power rail which provides the ability to maintain improved IR drop and reduces the frequency at which the power rail needs to be supplied. Simply increasing the aspect ratio of the power rail in the lowest level of metal is often difficult as it would drive larger aspect-ratio vias to connect signal lines to the device (e.g., higher via resistance), or would require the signal lines to also have a similar aspect ratio, which would cause increased capacitance between tracks in the BEOL. Another prior approach includes "burying" or positioning the power rails underneath a physical device (e.g., transistor), where the aspect ratio of the power rail can be increased independent of the signal lines in the BEOL, thus providing a means to significantly lower resistance through the power rail without driving any negative impact to either via resistance or capacitance in the BEOL. In this method, power is supplied to the metal contacts through a bottom-up approach as opposed to the conventional wiring structure with power rails positioned either in plane with, or above, a transistor cell. However, further BPR and BSPDN methodologies are necessary for future scaling enablement beyond the 5 nm technology node.

SUMMARY

In accordance with an embodiment, a semiconductor structure is provided. The semiconductor structure includes a first circuit row, a first power rail on a front side of the first circuit row, a second power rail on a back side of the first circuit row, and a first cell in the first circuit row, wherein the first cell includes one or more power vias connecting the first power rail to the second power rail.

In accordance with another embodiment, a semiconductor structure is provided. The semiconductor structure includes a plurality of circuit rows, a plurality of first power rails positioned on front sides of the plurality of circuit rows, a plurality of second power rails positioned on back sides of the plurality of circuit rows, and power tap cells associated with each the plurality of circuit rows, wherein each of the power tap cells includes one or more power vias connecting at least one first power rail of the plurality of first power rails to at least one second power rail of the plurality the second power rails.

In accordance with yet another embodiment, a semiconductor structure is provided. The semiconductor structure includes a first power rail on a front side of a stacked field effect transistor (FET), a second power rail on a back side of the stacked FET, and a tap power cell having one or more power vias connecting the first power rail to the second power rail.

In one preferred aspect, the second power rail is orthogonal to the first power rail.

In another preferred aspect, the first power rail is horizontally offset from the second power rail.

In yet another preferred aspect, the one or more power vias have at least two or more different sized power vias.

In one preferred aspect, the one or more power vias include at least two or more different aspect ratios.

In another preferred aspect, the first cell is positioned on an edge of the first circuit row.

In yet another preferred aspect, additional power rails are positioned over the first power rail, such that the additional power rails are perpendicular to the first power rail.

In yet another preferred aspect, a plurality of second power rails are orthogonal to a plurality of first power rails.

In one preferred aspect, the plurality of first power rails are horizontally offset from the plurality of second power rails.

In another preferred aspect, each of the plurality of circuit rows is associated with a single power tap cell of the power tap cells.

In yet another preferred aspect, at least one power tap cell of the power tap cells is positioned within two circuit rows of the plurality of circuit rows.

In yet another preferred aspect, the power tap cells are positioned on an edge of the plurality of circuit rows.

In yet another preferred aspect, additional power rails are positioned over the plurality of first power rails, such that the additional power rails are perpendicular to the plurality of first power rails.

The advantages of the present invention include producing transistors that consume less power, have better performance, occupy less area on a wafer, and reduce cost in semiconductor manufacturing. The advantages of the present invention further include improving IR drop with front side and back side power delivery networks. The IR drop refers to a voltage drop when current flows through a resistor. Relentless scaling of transistors and wires in advanced semiconductor technologies has not only resulted in major process-related challenges but has also imposed design challenges in the sub-5 nm technology regime. Dimensional scaling of designs has been made possible by FEOL and BEOL pitch scaling, which worsens short-channel effects in transistors and increases wire/contact resistances and fin depopulation in standard cells, which causes degradation of transistor drive. To enable further area scaling in sub-5 nm nodes, an approach of burying the power rails into the substrate has been proposed, which no longer requires reserving two routing tracks for power nets (e.g., VDD or VSS) in the standard cell area. Additionally, these BPRs can achieve a higher aspect ratio, thus, exhibiting lower resistance than local level BEOL power rails. The exemplary embodiments of the present invention construct a front side power rail connection to the back side power distribution network (BSPDN) by advantageously using power tap cells. The front side power rail is positioned on a side of a circuit row. In one embodiment, the back side power rail is advantageously offset from the front side power rail. In another embodiment, the back side power rail is advantageously orthogonal to the front side power rail. A power via within a tap cell is advantageously placed in the circuit row connecting the front side power rail with the back side power rail. The power vias can advantageously include different sizes and/or aspect ratios.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for constructing a front side power rail connection to the back side power distribution network (BSPDN) by advantageously using power tap cells. The front side power rail is positioned on a side of a circuit row. The back side power rail is advantageously offset from the front side power rail. A power via within a tap cell is advantageously placed in the circuit row connecting the front side power rail with the back side power rail. In another embodiment, the back side power rail is advantageously orthogonal to the front side power rail. The power vias can advantageously include different sizes and/or aspect ratios.

Examples of semiconductor materials that can be used in forming such structures include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
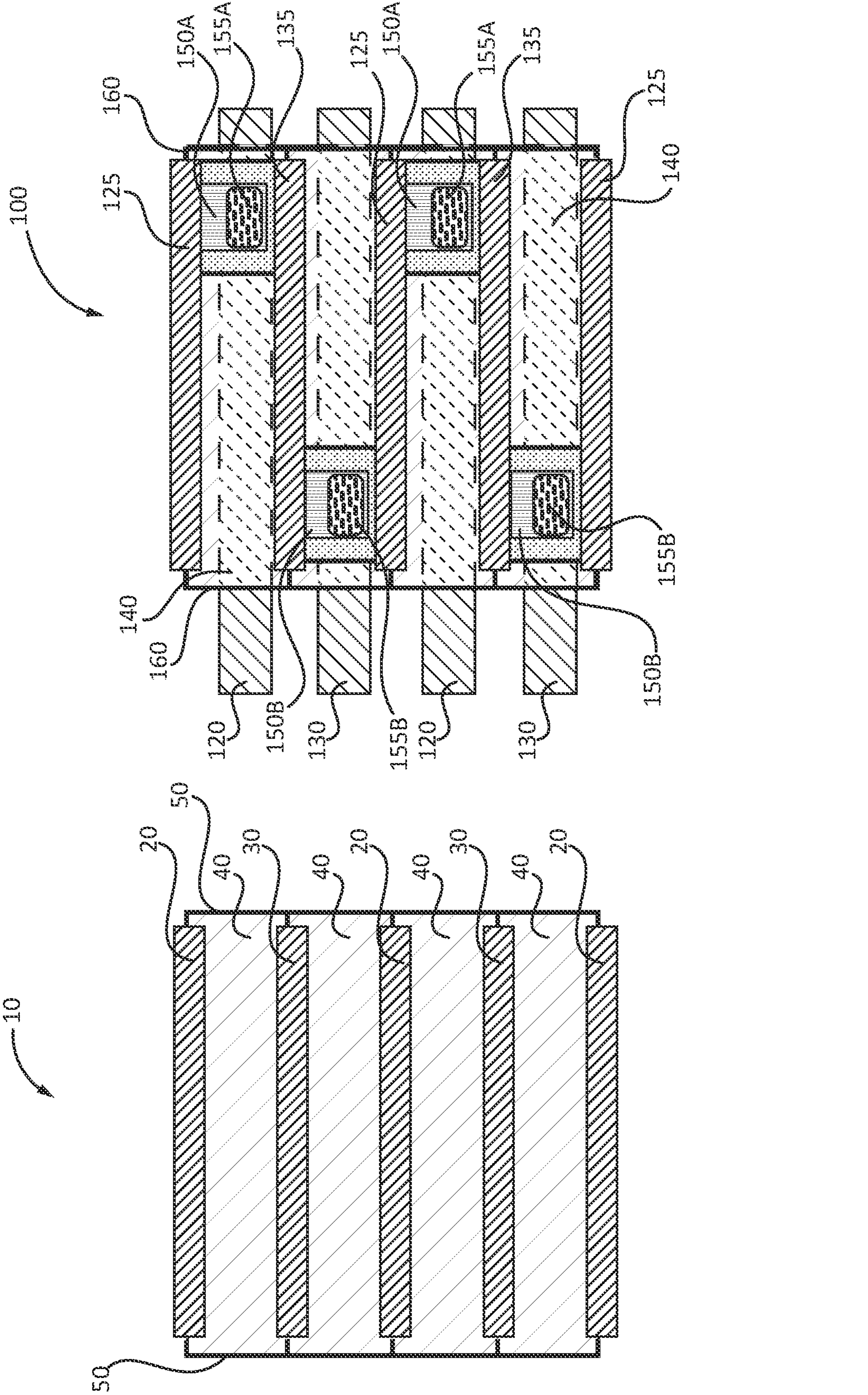
FIG. 1 is a top view of a circuit diagram of a conventional front side power rail with circuit rows (left-hand side) verses a front side power rail connected to a backside power delivery network by power tap cells (right-hand side), in accordance with an embodiment of the present invention.

FIG. 1 is a top view of a circuit diagram of a conventional front side power rail with circuit rows (left-hand side) verses a front side power rail connected to a backside power delivery network by power tap cells (right-hand side), in accordance with an embodiment of the present invention.

The top view illustrates a conventional circuit structure 10 with front side power rails 20, 30. Front side power rails 20 are VSS front side power rails, whereas front side power rails 30 are VDD front side power rails. Circuit rows 40 are also illustrated. The circuit rows 40 are positioned between the front side power rails 20, 30. The front side power rails 20, 30 are electrically connected by wiring 50. Wiring 50 refers to multiple physical wires such that wiring 50 can connect all front side power rails 20 (VSS) together and separately connect all front side power rails 30 (VDD) together.

In various example embodiments, the top view illustrates the circuit structure 100 of the present invention with front side power rails 125, 135. The front side power rails 125 are VSS front side power rails, whereas the front side power rails 135 are VDD front side power rails. Circuit rows 140 are also illustrated. The circuit rows 140 are positioned between the front side power rails 125, 135. The front side power rails 125, 135 are electrically connected by wiring 160 to back side power rails 120, 130. The back side power rails 120 are VSS back side power rails and the back side power rails 130 are VDD back side power rails. The front side power rails 125, 135 are horizontally offset from the back side power rails 120, 130. The front side power rails 125, 135 extend on sides of the circuit row 140, whereas the back side power rails 120, 130 extend centrally along the circuit row 140. The front side power rails 125, 135 can also be referred to as M1 lines.

Tap cells 150A, 150B are also advantageously formed. The tap cells 150A are advantageously connected to the back side power rails 120, whereas the tap cells 150B are advantageously connected to the back side power rails 130. The tap cells 150A include power vias 155A, whereas the tap cells 150B include power vias 155B. The tap cells 150A and the tap cells 150B are advantageously positioned over the circuit rows 140. The tap cells 150A with the power vias 155A are positioned on the edge of the circuit rows 140 (right hand side edge). The tap cells 150A are shown to be vertically aligned with each other. The tap cells 150B with the power vias 155B are positioned on the edge of the circuit rows 140 (left hand side edge). The tap cells 150B are shown to be vertically aligned with each other. Moreover, there is one tap cell for VDD and another tap cell for VSS.

Therefore, the circuit structure 100 includes a first circuit row, a first power rail on a front side of the first circuit row, a second power rail on a back side of the first circuit row, and a first cell in the first circuit row, wherein the first cell advantageously includes one or more power vias connecting the first power rail to the second power rail. The first power rail is advantageously horizontally offset from the second power rail. The first cell is positioned on an edge of the first circuit row.

Integrated circuits usually include thousands of components having complex interrelationships. These circuits are generally designed using highly automated processes known as electronic design automation (EDA). EDA begins from a functional specification provided in a hardware description language (HDL) and continues through the specification of a circuit design including the specification of elementary circuit components called cells, the physical arrangement of the cells, and the wiring that interconnects the cells. The cells implement logic or other electronic functions using a particular integrated circuit technology.

EDA can be divided into a series of stages such as synthesis, placement, routing, etc. Each of these steps can involve selecting cells from a library of cells. Usually, a very large number of different circuit designs using various cell combinations can meet a functional specification for a circuit. Latch-up is a type of short circuit that sometimes occurs in integrated circuits due to parasitic bipolar transistors formed by adjacent junctions in the integrated circuit. EDA tools may include tap cells in integrated circuit designs, which can provide a body bias of transistors to prevent latch-up.

Well tap cells or tap cells are used to prevent latch-up issues in complementary metal oxide semiconductor (CMOS) design. Well tap cells connect the n-well to VDD and the p-substrate to VSS in order to prevent latch-up issues. There is no logical function in the well tap cell. Instead, the well tap cell provides a taping to the n-well and the p-substrate. Thus, the well tap cell can also be referred to as a physical-only cell. A cell library may include the tap cells. Tap cells prevent the undesirable latch-up of integrated circuits, which can result from parasitic bipolar transistors formed in integrated circuits. Through the tap cells, n-well regions are coupled to VDD power rails, and p-well regions or p-type substrates are coupled to VSS power rails (typically electrical ground).

In some integrated design processes, a predetermined, maximum tap-to-tap distance may be specified, and tap cells are distributed in the floor plan accordingly. This maximum tap-to-tap distance may be determined, for example, using test chips with arrays of inverters that provide a worst case latch-up condition to determine cell placements so as to avoid latch-up. However, depending on the actual functional design for the integrated circuit device to be manufactured, such maximum tap-to-tap distances do not determine or even estimate the potential latch-up susceptibility across actual cell distributions for a particular design. This can result in providing too many tap cells, causing area waste for designs where a lower tap density would suffice, and further potentially resulting in timing degradation such as in high-performance products. In such high-performance designs, higher tap density may interfere with optimal cell placement, making critical wiring paths longer. Further, some areas may be provided with insufficient tap cells, resulting in latch-up. The exemplary embodiments of the present invention can alleviate such issues by advantageously presenting tap cells with one or more power vias that connect front side power rails to back side power rails.

Figure 2:
FIG. 2 is a top view of the front side power rail connected to the backside power delivery network by power tap cells where the backside metal runs orthogonal to the front side power rail, in accordance with another embodiment of the present invention.
Figure 2:
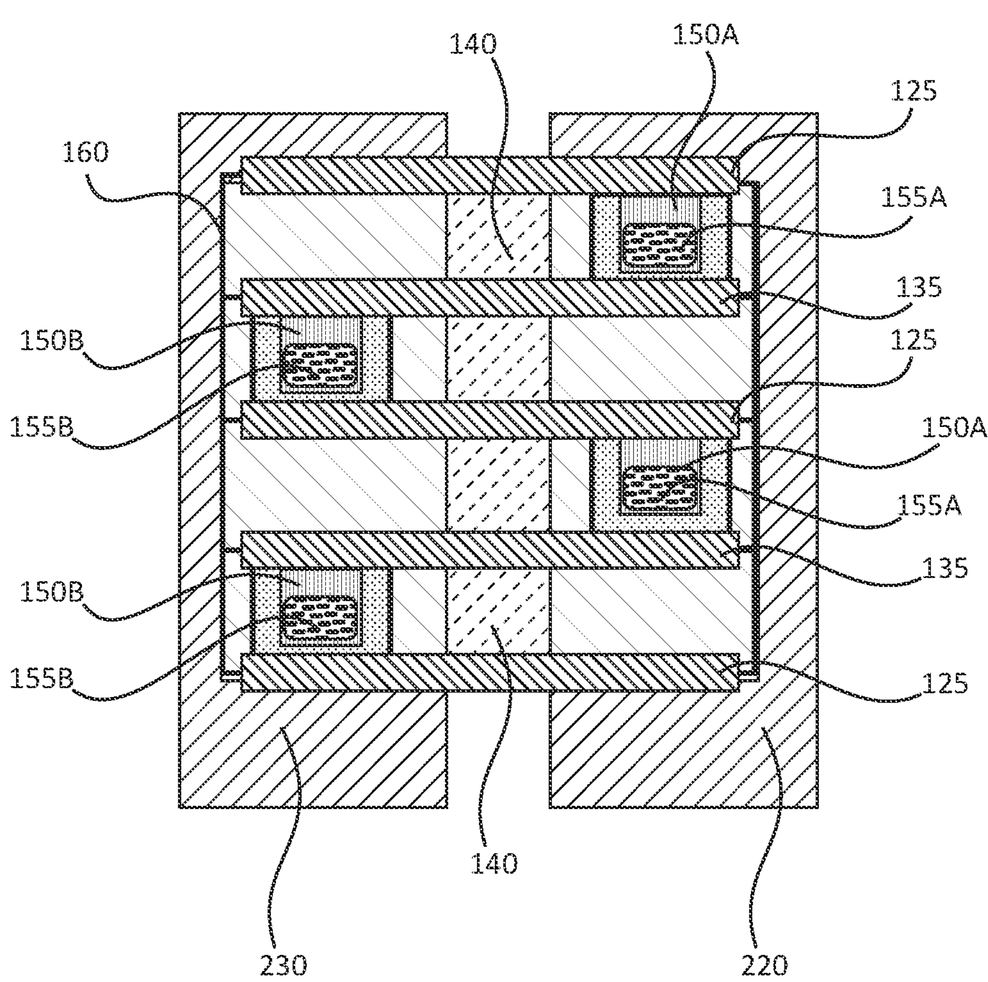

FIG. 2 is a top view of the front side power rail connected to the backside power delivery network by power tap cells where the backside metal runs orthogonal to the front side power rail, in accordance with another embodiment of the present invention.

In various example embodiments, in the circuit structure 200, the back side power rails 220, 230 are orthogonal to the front side power rails 125, 135.

Similarly to FIG. 1, the front side power rails 125 are VSS front side power rails, whereas the front side power rails 135 are VDD front side power rails. Circuit rows 140 are also illustrated. The circuit rows 140 are positioned between the front side power rails 125, 135. The front side power rails 125, 135 are electrically connected by wiring 160 to back side power rails 120, 130. The back side power rails 120 are VSS back side power rails and the back side power rails 130 are VDD back side power rails. In contrast to FIG. 1, the back side power rails 220, 230 are advantageously orthogonal to the front side power rails 125, 135.

The tap cells 150A are advantageously connected to the back side power rail 220, whereas the tap cells 150B are advantageously connected to the back side power rail 230. The tap cells 150A include power vias 155A, whereas the tap cells 150B include power vias 155B. The tap cells 150A and the tap cells 150B are positioned over the circuit rows 140. The tap cells 150A with the power vias 155A are positioned on the edge of the circuit rows 140 (right hand side edge). The tap cells 150A are shown to be vertically aligned with each other. The tap cells 150B with the power vias 155B are positioned on the edge of the circuit rows 140 (left hand side edge). The tap cells 150B are shown to be vertically aligned with each other. Moreover, there is one tap cell for VDD and another tap cell for VSS.

Figure 3:
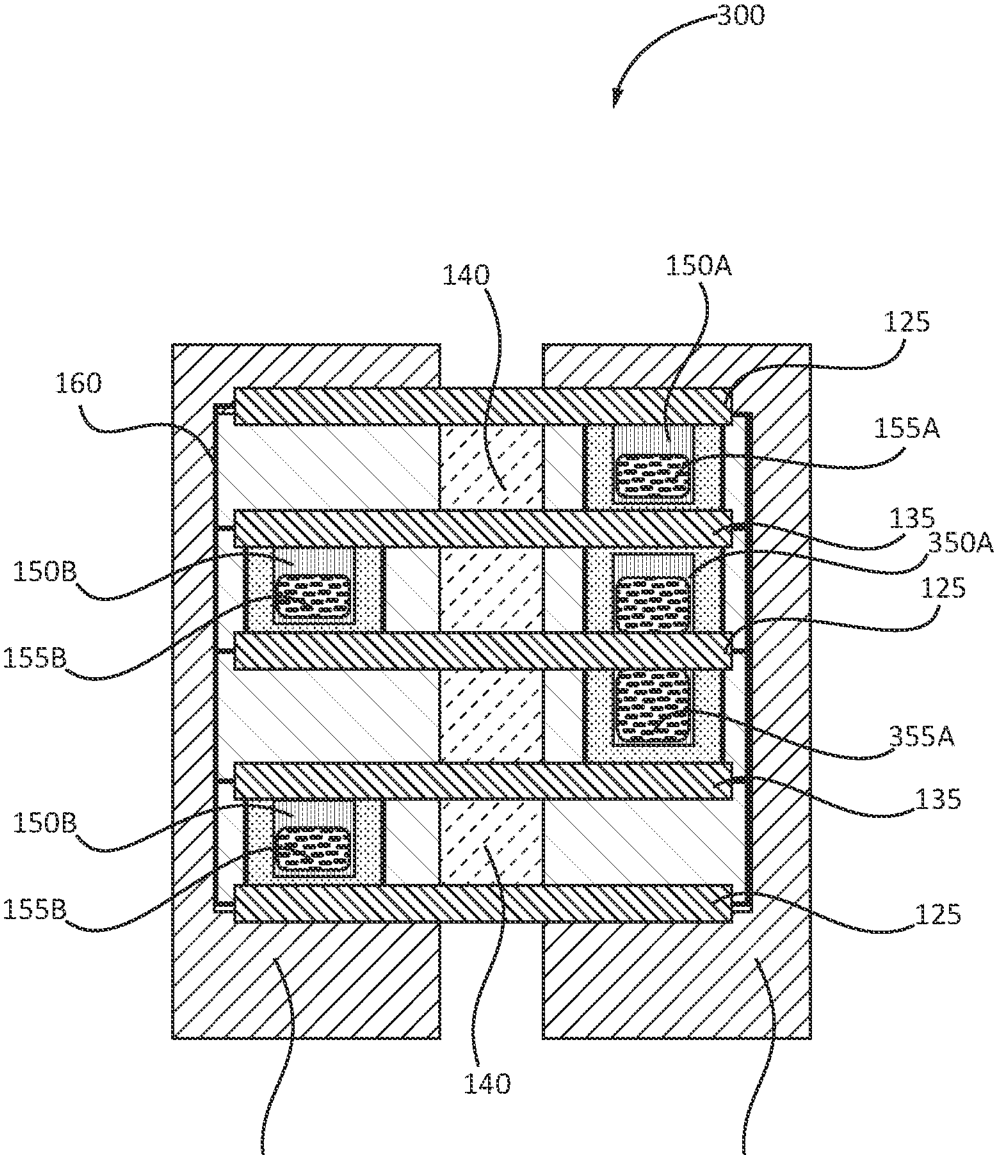
FIG. 3 is a top view of the front side power rail connected to the backside power delivery network by power tap cells where the backside metal runs orthogonal to the front side power rail and where at least one power tap cell is larger than the other power tap cells, in accordance with another embodiment of the present invention.

FIG. 3 is a top view of the front side power rail connected to the backside power delivery network by power tap cells where the backside metal runs orthogonal to the front side power rail and where at least one power tap cell is larger than the other power tap cells, in accordance with another embodiment of the present invention.

In various example embodiments, the front side power rails are connected to the backside power delivery network by power tap cells where the backside metal runs orthogonal to the front side power rails and where at least one power tap cell is advantageously larger than the other power tap cells. In various example embodiments, in the circuit structure 300, the back side power rails 220, 230 are advantageously orthogonal to the front side power rails 125, 135. However, the size of the tap cells can be different. For example, the tap cell 350A is advantageously greater than or larger than the tap cells 150A and the tap cells 150B. The tap cell 350A includes a power via 355A. The tap cell 350A can extend between two circuit rows 140. The tap cell 350A can extend under the front side power rail 125 (centrally disposed). The tap cell 350A is vertically aligned with the tap cell 150A. The tap cell 250A can be horizontally aligned with at least one tap cell 150B. Thus, each circuit row 140 can advantageously accommodate at least one tap cell.

Figure 4:
FIG. 4 is a top view of the front side power rail connected to a backside power delivery network by power tap cells that are larger than the power tap cells of FIG. 1 to reduce via resistance, in accordance with another embodiment of the present invention.
Figure 4:
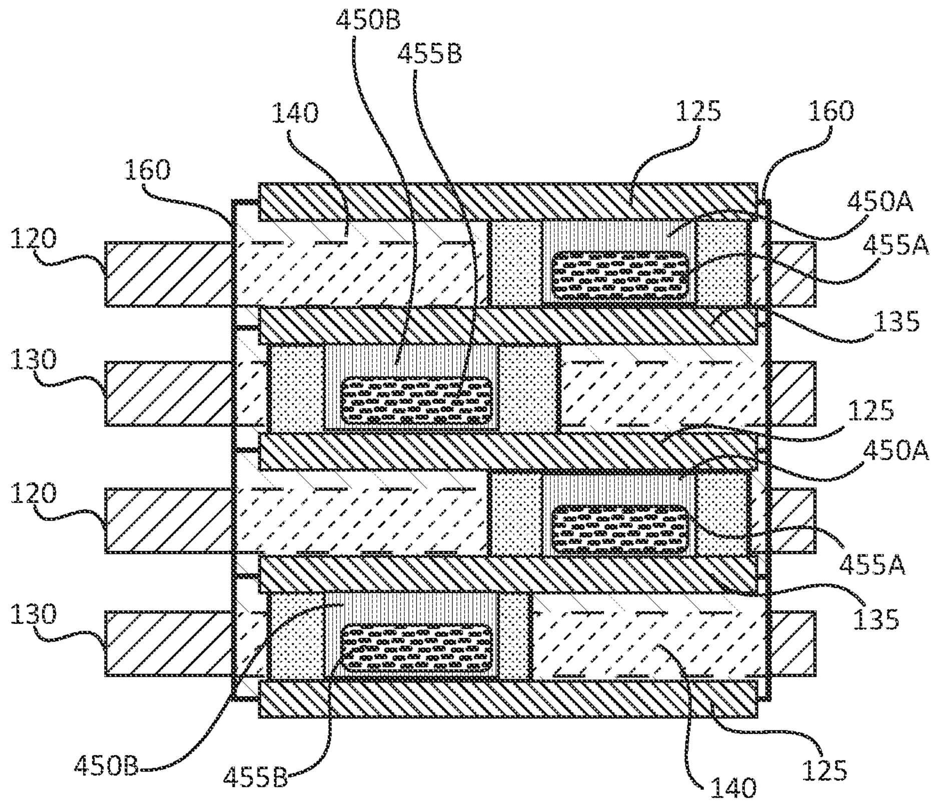

FIG. 4 is a top view of the front side power rail connected to a backside power delivery network by power tap cells that are larger than the power tap cells of FIG. 1 to reduce via resistance, in accordance with another embodiment of the present invention.

In various example embodiments, the top view illustrates the circuit structure 400 of the present invention with front side power rails 125, 135. The front side power rails 125 are VSS front side power rails, whereas the front side power rails 135 are VDD front side power rails. Circuit rows 140 are also illustrated. The circuit rows 140 are positioned between the front side power rails 125, 135. The front side power rails 125, 135 are electrically connected by wiring 160 to back side power rails 120, 130. The back side power rails 120 are VSS back side power rails and the back side power rails 130 are VDD back side power rails. The front side power rails 125, 135 are advantageously horizontally offset from the back side power rails 120, 130. The front side power rails 125, 135 extend on sides of the circuit row 140, whereas the back side power rails 120, 130 extend centrally along the circuit row 140.

The tap cells 450A are advantageously connected to the back side power rails 120, whereas the tap cells 450B are advantageously connected to the back side power rails 130. The tap cells 450A include power vias 455A, whereas the tap cells 450B include power vias 455B. The tap cells 450A and the tap cells 450B are positioned over the circuit rows 140. The tap cells 450A with the power vias 455A are positioned on the edge of the circuit rows 140 (right hand side edge). The tap cells 450A are shown to be vertically aligned with each other. The tap cells 450B with the power vias 455B are positioned on the edge of the circuit rows 140 (left hand side edge). The tap cells 450B are shown to be vertically aligned with each other. Moreover, there is one tap cell for VDD and another tap cell for VSS. However, the tap cells 450A and the tap cells 450B are advantageously larger than the tap cells 150A and the tap cells 150B of FIG. 1. The tap cells 450A, 450B have more of an elongated configuration to advantageously reduce via resistance.

Therefore, the circuit structure 400 includes a plurality of circuit rows, a plurality of first power rails positioned on front sides of the plurality of circuit rows, a plurality of second power rails positioned on back sides of the plurality of circuit rows, and power tap cells associated with each the plurality of circuit rows, wherein each of the power tap cells advantageously includes one or more power vias connecting at least one first power rail of the plurality of first power rails to at least one second power rail of the plurality the second power rails. The plurality of first power rails are horizontally offset from the plurality of second power rails. In some embodiments, the one or more power vias advantageously include at least two or more different sized power vias. In other embodiments, the one or more power vias advantageously have at least two or more different aspect ratios. Each of the plurality of circuit rows is associated with a single power tap cell of the power tap cells. At least one power tap cell of the power tap cells is advantageously positioned within two circuit rows of the plurality of circuit rows. The power tap cells are positioned on an edge of the plurality of circuit rows.

Figure 5:
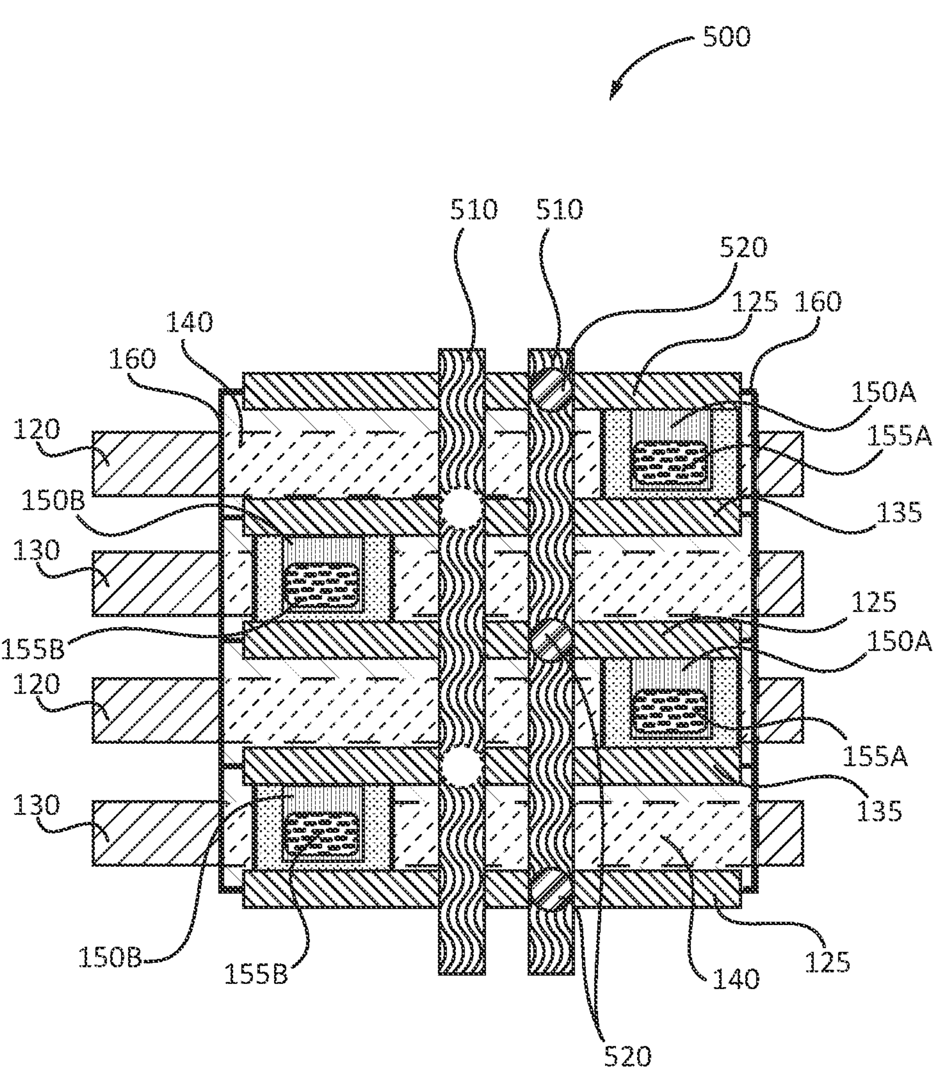
FIG. 5 is a top view of the front side power rail connected to a backside power delivery network by power tap cells where additional front side power rails are employed to reduce the number of power tap cells, in accordance with another embodiment of the present invention.

FIG. 5 is a top view of the front side power rail connected to a backside power delivery network by power tap cells where additional front side power rails are employed to reduce the number of power tap cells, in accordance with another embodiment of the present invention.

In various example embodiments, the top view illustrates the circuit structure 500 of the present invention with front side power rails 125, 135. However, additional front side power rails 510 can advantageously be formed over the front side power rails 125, 135. The additional front side power rails 510 can be, e.g., M2 lines. The additional front side power rails 510 can advantageously improve IR drop and/or reduce the number of power tap cells in the circuit structure 500.

Figure 6:
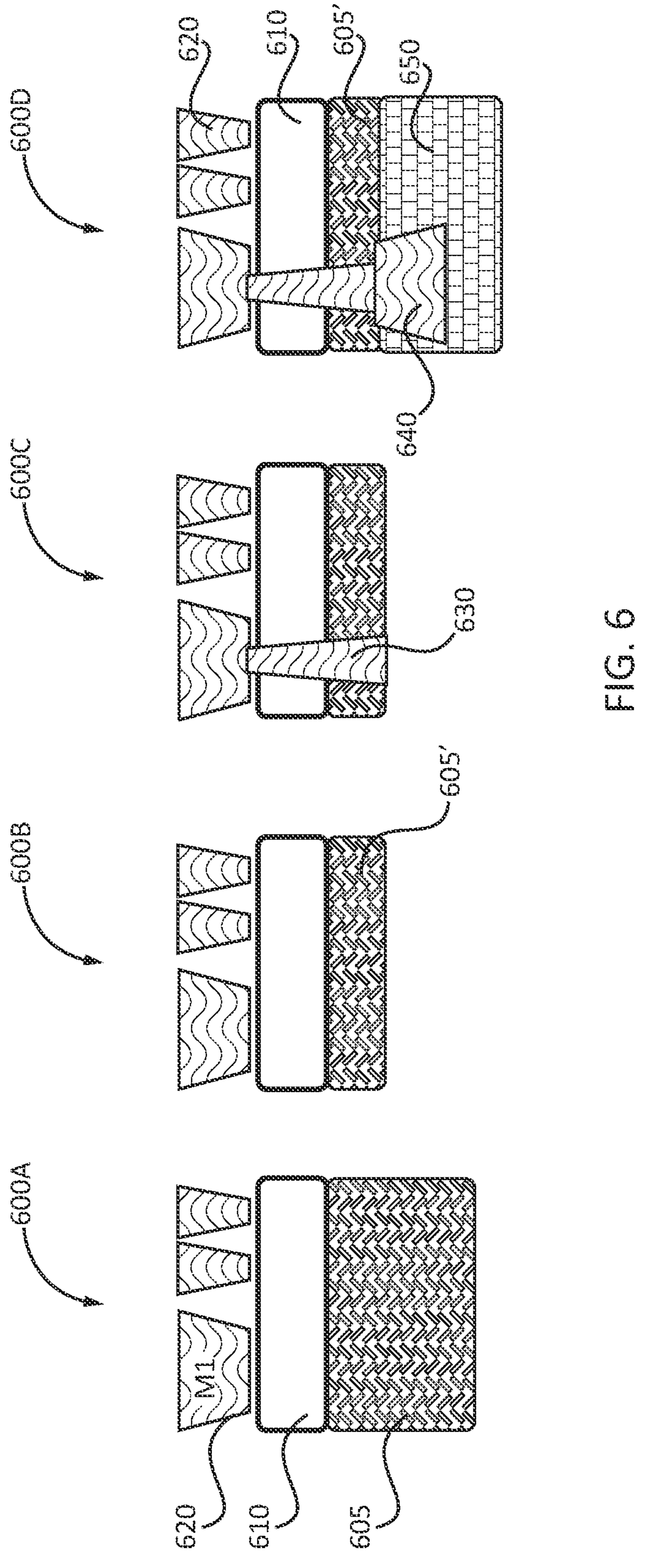
FIG. 6 is process flow for forming the front side power rail connected to a backside power delivery network by power tap cells, in accordance with an embodiment of the present invention.

FIG. 6 is process flow for forming the front side power rail connected to a backside power delivery network by power tap cells, in accordance with an embodiment of the present invention.

In various example embodiments, the process flow for forming the front side power rail connected to a backside power delivery network by power tap cells is illustrated.

In structure 600A, a device region 610 is formed over a substrate 605. M1 lines 620 are formed over the device region 610. The M1 lines can be the front side power rails. Therefore, transistors and front-side interconnect wiring is formed.

In structure 600B, the wafer is flipped and the substrate 605 is thinned to thinned substrate 605'.

In structure 600C, a through-silicon via (TSV) 630 is formed from the thinned substrate 605' to the M1 lines 620. The TSV 630 is formed from the back side connecting to the front side M1 lines 620.

In structure 600D, back side interconnect wiring 640 and a dielectric 650 are formed.

Figure 7:
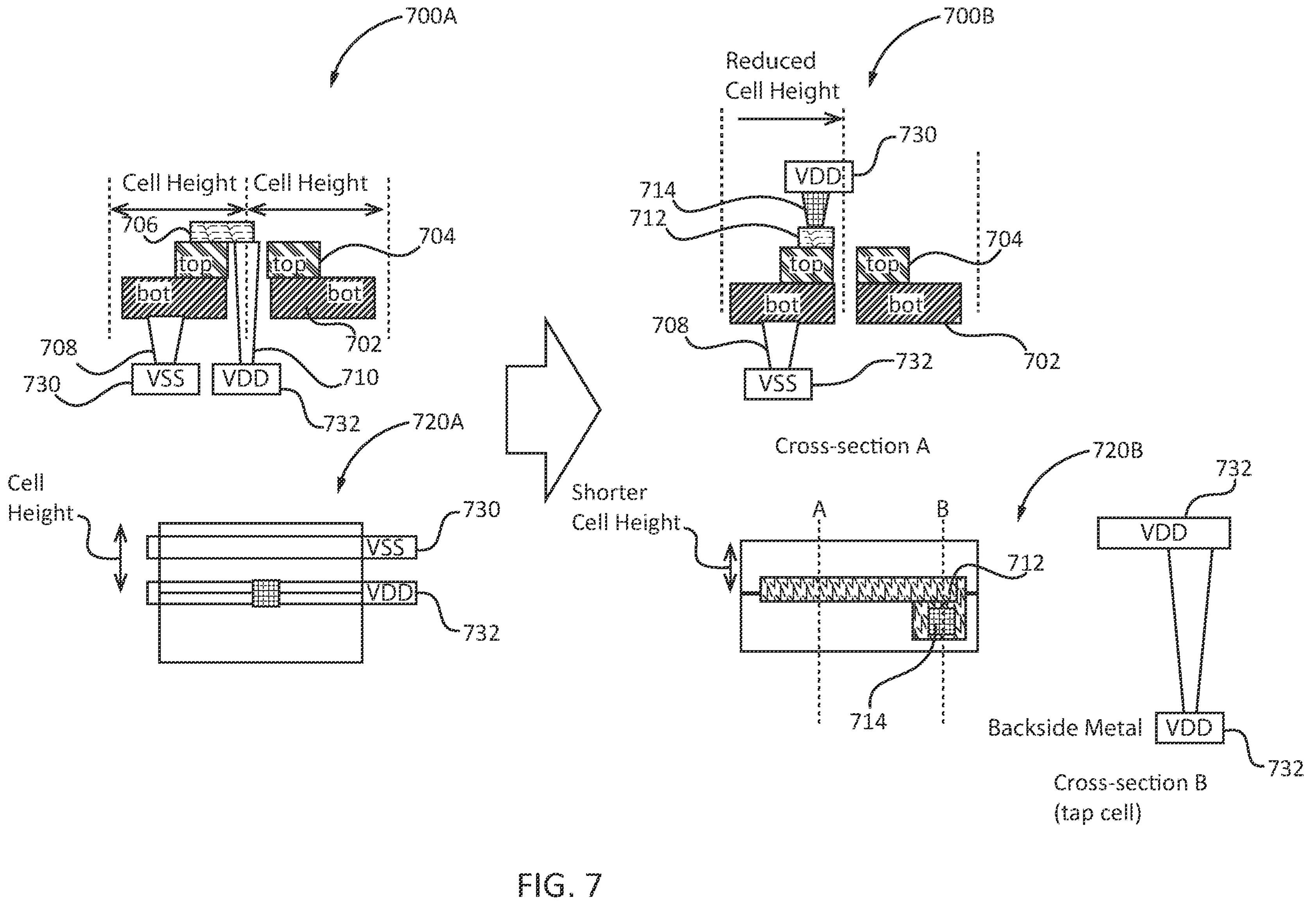
FIG. 7 illustrates how the power tap cells apply to stacked field effect transistors (FETs), in accordance with an embodiment of the present invention.

FIG. 7 illustrates how the power tap cells apply to stacked field effect transistors (FETs), in accordance with an embodiment of the present invention.

In structure 700A, a top FET 704 is stacked over a bottom FET 702. Vias 708, 710 can be formed. The via 708 extends to the backside metal VSS 730 and the via 710 extends to the backside metal VDD 732. Metal lines 706 can be formed over the stacked FET.

Structure 720A illustrates a top view of the cell height, as well as the backside metals VSS 730 and VDD 732.

In various example embodiments, in structure 700B, according to the present invention, the top FET 704 is stacked over the bottom FET 702. A via 708 can be formed. The via 708 extends to the backside metal VSS 730. Metal lines 712 can be formed over the stacked FET and a tap cell 714 is advantageously shown connected to the metal lines 712 to achieve the benefit of a reduced cell height. The backside metal VDD 732 is formed over the tap cell 714.

Structure 720B illustrates a top view of the cell height, as well as the tap cell 714. The tap cell 714 results in having a structure with the benefit of a shorter cell height. Additionally, structure 700B is a cross-section along axis A of the top view. A cross section along axis B is also shown, which extends through the tap cell 714 to illustrate the backside metal VDD 732.

In conclusion, the exemplary embodiments of the present invention present methods and devices for constructing a front side power rail connection to the back side power distribution network (BSPDN) by advantageously using power tap cells. The front side power rail is positioned on a side of a circuit row. The back side power rail is advantageously offset from the front side power rail. A power via within a tap cell is advantageously placed in the circuit row connecting the front side power rail with the back side power rail. In another embodiment, the back side power rail is advantageously orthogonal to the front side power rail. The power vias can advantageously include different sizes and/or aspect ratios.

Regarding FIGS. 1-7, deposition is any process that grows, coats, or otherwise transfers a material onto a wafer. Available technologies include, but are not limited to, thermal oxidation, physical vapor deposition (PVD), chemical vapor deposition (CVD), electrochemical deposition (ECD), molecular beam epitaxy (MBE) and more recently, atomic layer deposition (ALD) among others. As used herein, "depositing" can include any now known or later developed techniques appropriate for the material to be deposited including but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

The term "processing" as used herein includes deposition of material or photoresist, patterning, exposure, development, etching, cleaning, stripping, implanting, doping, stressing, layering, and/or removal of the material or photoresist as needed in forming a described structure.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which usually include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of methods and structures providing for constructing a front side power rail connection to the backside power distribution network (BSPDN) by using power tap cells (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor structure comprising:
- a first circuit row;
- a first power rail on a front side of the first circuit row;
- a second power rail on a back side of the first circuit row, wherein the first power rail is horizontally offset from the second power rail; and
- a first cell in the first circuit row, wherein the first cell includes one or more power vias connecting the first power rail to the second power rail.

2. The semiconductor structure of claim 1, wherein the one or more power vias have at least two or more different sized power vias.

3. The semiconductor structure of claim 1, wherein the one or more power vias include at least two or more different aspect ratios.

4. The semiconductor structure of claim 1, wherein the first cell is positioned on an edge of the first circuit row.

5. The semiconductor structure of claim 1, wherein additional power rails are positioned over the first power rail, such that the additional power rails are perpendicular to the first power rail.

6. A semiconductor structure comprising:
- a plurality of circuit rows;
- a plurality of first power rails positioned on front sides of the plurality of circuit rows;
- a plurality of second power rails positioned on back sides of the plurality of circuit rows, wherein the plurality of first power rails are horizontally offset from the plurality of second power rails; and
- power tap cells associated with each of the plurality of circuit rows, wherein each of the power tap cells includes one or more power vias connecting at least one first power rail of the plurality of first power rails to at least one second power rail of the plurality of second power rails.

7. The semiconductor structure of claim 6, wherein the one or more power vias include at least two or more different sized power vias.

8. The semiconductor structure of claim 6, wherein the one or more power vias have at least two or more different aspect ratios.

9. The semiconductor structure of claim 6, wherein each of the plurality of circuit rows is associated with a single power tap cell of the power tap cells.

10. The semiconductor structure of claim 6, wherein at least one power tap cell of the power tap cells is positioned within two circuit rows of the plurality of circuit rows.

11. The semiconductor structure of claim 6, wherein the power tap cells are positioned on an edge of the plurality of circuit rows.

12. The semiconductor structure of claim 6, wherein additional power rails are positioned over the plurality of first power rails, such that the additional power rails are perpendicular to the plurality of first power rails.

13. A semiconductor structure comprising:

a first power rail on a front side of a stacked field effect transistor (FET);

a second power rail on a back side of the stacked FET, wherein the first power rail is horizontally offset from the second power rail; and a tap power cell having one or more power vias connecting the first power rail to the second power rail.

14. The semiconductor structure of claim 13, wherein the one or more power vias have at least two or more different sized power vias.

15. The semiconductor structure of claim 13, wherein the one or more power vias include at least two or more different aspect ratios.

16. The semiconductor structure of claim 13, wherein the tap power cell is positioned on an edge of a circuit row.

17. The semiconductor structure of claim 13, wherein additional power rails are positioned over the first power rail, such that the additional power rails are perpendicular to the first power rail.

* * * * *